US006703761B2

(12) United States Patent
Gallmeyer et al.

(10) Patent No.: US 6,703,761 B2
(45) Date of Patent: Mar. 9, 2004

(54) METHOD AND APPARATUS FOR RESTRAINING TEMPERATURE INDUCED DEFORMATION OF A PIEZOELECTRIC DEVICE

(75) Inventors: Christopher F. Gallmeyer, Peoria, IL (US); L. Glenn Waterfield, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 0 days.

(21) Appl. No.: 10/036,688

(22) Filed: Dec. 21, 2001

(65) Prior Publication Data

US 2003/0117042 A1 Jun. 26, 2003

(51) Int. Cl.[7] ................................................ H01I 41/08
(52) U.S. Cl. ................... 310/316.01; 310/328; 310/330
(58) Field of Search ........................... 310/316.01, 317, 310/319, 378, 330–332

(56) References Cited

U.S. PATENT DOCUMENTS

| 3,582,691 | A |   | 6/1971  | Sonderegger et al. |         |
|-----------|---|---|---------|--------------------|---------|
| 3,899,698 | A | * | 8/1975  | Kleinschmidt       | 310/319 |
| 4,056,742 | A |   | 11/1977 | Tibbetts           |         |
| 4,451,753 | A | * | 5/1984  | Ogawa et al.       | 310/315 |
| 4,492,360 | A | * | 1/1985  | Lee, II et al.     | 251/129 |
| 4,625,139 | A | * | 11/1986 | Frisch             | 310/330 |
| 4,803,393 | A |   | 2/1989  | Takahashi          |         |
| 4,813,601 | A |   | 3/1989  | Schwerdt et al.    |         |
| 4,871,939 | A |   | 10/1989 | Clouser            |         |
| 5,099,461 | A |   | 3/1992  | Fitzgerald         |         |
| 5,231,326 | A | * | 7/1993  | Echols             | 310/339 |
| 5,245,245 | A | * | 9/1993  | Goldenberg         | 310/330 |
| 5,761,782 | A |   | 6/1998  | Sager              |         |
| 5,798,600 | A |   | 8/1998  | Sager et al.       |         |
| 6,074,178 | A | * | 6/2000  | Bishop et al.      | 417/322 |
| 6,166,478 | A |   | 12/2000 | Yi et al.          |         |
| 6,184,609 | B1|   | 2/2001  | Johansson et al.   |         |
| 6,194,812 | B1|   | 2/2001  | Klugl et al.       |         |
| 6,329,741 | B1| * | 12/2001 | Vartuli et al.     | 310/363 |

* cited by examiner

*Primary Examiner*—Mark Budd
(74) *Attorney, Agent, or Firm*—Clifton G Green; Kelsey L Milman

(57) ABSTRACT

Apparatuses and methods for controlling the temperature induced deformation of a piezoelectric device. A piezoelectric device receives an activation signal and displaces in a first direction for a first predetermined distance as a function of the activation signal. The piezoelectric device also displaces in a second direction as a function of a change in temperature of the piezoelectric device. A stop is located a second predetermined distance from the piezoelectric device. The stop prevents the displacement of the piezoelectric device in the second direction beyond a third predetermined distance. A charge redistributing device is coupled with the piezoelectric device. The charge redistributing device redistributes charge on the piezoelectric device due to the temperature change to relieve internal electric fields of the piezoelectric device due to temperature induced deformation of the piezoelectric device.

9 Claims, 5 Drawing Sheets

Fig_2_

US 6,703,761 B2

METHOD AND APPARATUS FOR RESTRAINING TEMPERATURE INDUCED DEFORMATION OF A PIEZOELECTRIC DEVICE

DESCRIPTION

1. Technical Field

This invention relates generally to a piezoelectric device, and more specifically to controlling the temperature induced deformation of a piezoelectric device.

2. Background

Piezoelectric devices, such as piezoelectric actuators, generally consist of a piezoelectric material that deforms when an electric field is applied across it. Additional materials may be bonded with the piezoelectric material, such as metallic layers that act as electrodes, insulating materials to prevent current from flowing between particular areas of the device, and adhesives to bond the various layers together.

One common feature that most piezoelectric actuators have is that they are sensitive to temperature, growing or shrinking in particular dimensions as a function of changes in temperature.

FIG. 1 shows one type of piezoelectric device: a piezoelectric bender actuator 10. A typical piezoelectric bender actuator 10 typically consists of an electroactive layer 12, such as some types of ceramic, disposed between two electrodes 14, although other configurations are also possible. The bender actuator 10 may be pre-stressed by ways known to those skilled in the art to have a domed configuration. Examples of such pre-stressed piezoelectric bender actuators 10 may be found in U.S. Pat. Nos. 5,471,721 and 5,632,841.

The bender actuator 10 may be coupled with any of a variety of moveable objects, such as a rod 16 or a mirror (not shown). A return spring 18 may be coupled with the rod 16 to keep the rod 16 in contact with the bender actuator 10.

FIG. 2 shows the piezoelectric bender actuator 10 when an activation signal, e.g., power, such as an operating voltage or current, is applied. When power is applied to the bender actuator 10, such as a voltage being applied across the electrodes 14, an electric field is induced across the electroactive layer 12. The electric field typically causes the domed actuator 10 to displace in a first direction, such as flatten, as shown in FIG. 2. Alternately, the electric field could cause an increase in doming. When the bender actuator 10 flattens, it may move the rod 16. Typically the stroke of the bender actuator 10 will be calculated to move the rod 16 from a first predetermined position to a second predetermined position, or vice versa (FIG. 1 vs. FIG. 2).

One problem with many piezoelectric actuators 10, including bender actuators, is that they are sensitive to temperature. Many piezoelectric bender actuators 10 change their dome height as a function of temperature. Typically as the temperature drops, the piezoelectric bender actuator 10 will increase its dome height. This poses problems in that the operating voltage will not cause the piezoelectric bender actuator to travel through its intended full stroke length.

For example, a particular piezoelectric bender actuator 10 may have 100 microns of stroke from its rest/domed (no voltage applied; FIG. 1) position to its fully or nearly flattened position (operating voltage applied; FIG. 2). However, temperature induced deformation, e.g., due to cold, may cause an additional 100 microns of doming of the bender actuator 10. FIG. 3 shows one example of temperature deformation of the bender actuator 10. Thus, when the operating voltage is applied to the cold actuator 10 of FIG. 3, it flattens from 200 microns of dome height to 100 microns of dome height, and never becomes fully flattened (0 microns of dome height). In this instance, the bender actuator would only stroke back to its original (non-cold) position shown in FIG. 1.

In actuality, most benders never fully flatten, only flattening by ½ to ⅓ of its rest/dome height. However, for illustrative purposes, the embodiments of the invention will be described as having a fully flattened actuated position when full voltage is applied.

Further, the amount of temperature induced deformation will vary with magnitude of the temperature, with very cold temperatures typically causing more doming than less cold temperatures. Thus, the stroke of the bender actuator is often dependent on its temperature, which may be undesirable in many applications.

SUMMARY OF THE INVENTION

The present invention provides apparatuses and methods for controlling the temperature induced deformation of a piezoelectric device. A piezoelectric device receives an activation signal and displaces in a first direction for a first predetermined distance as a function of the activation signal. The piezoelectric device also displaces in a second direction as a function of a change in temperature of the piezoelectric device. A stop is located a second predetermined distance from the piezoelectric device. The stop prevents the displacement of the piezoelectric device in the second direction beyond a third predetermined distance. A charge redistributing device is coupled with the piezoelectric device. The charge redistributing device redistributes charge on the piezoelectric device due to the temperature change to relieve internal stresses of the piezoelectric device due to temperature induced deformation of the piezoelectric device.

DETAILED DESCRIPTION

Figure 1:
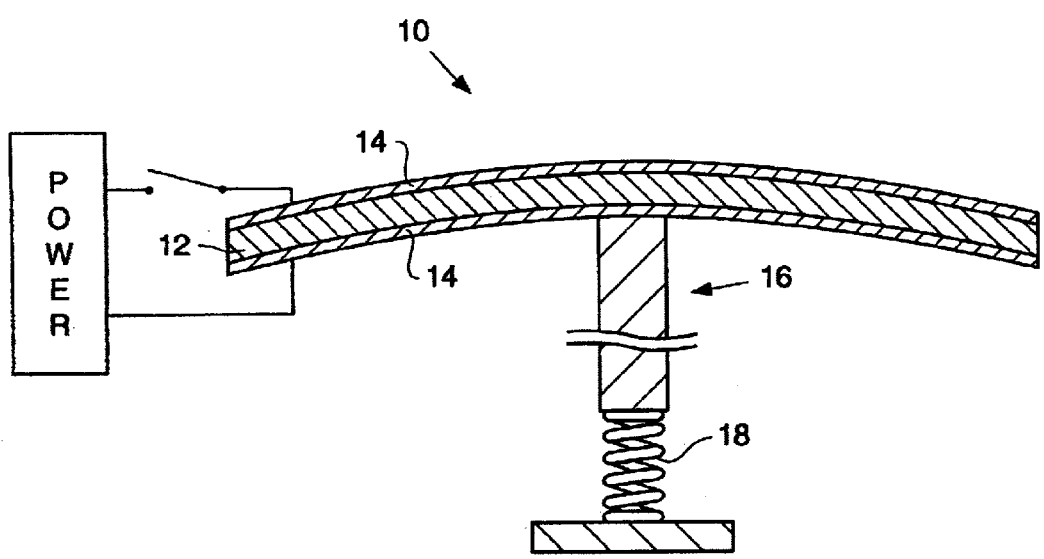
FIG. 1 shows one type of piezoelectric device: a piezoelectric bender actuator 10.
Figure 2:
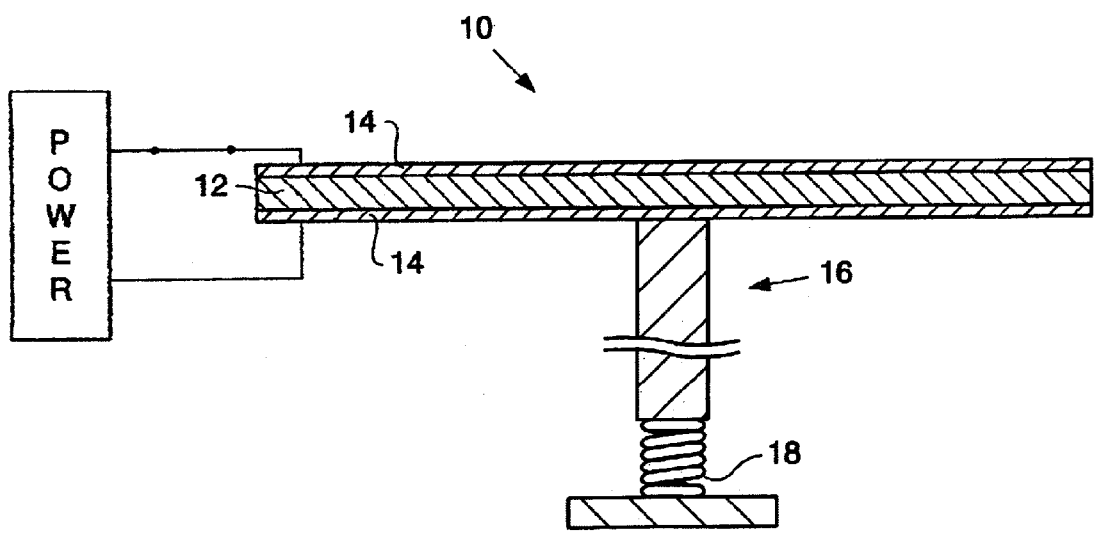
FIG. 2 shows the piezoelectric bender actuator 10 when power, e.g., an operating voltage, is applied.
Figure 3:
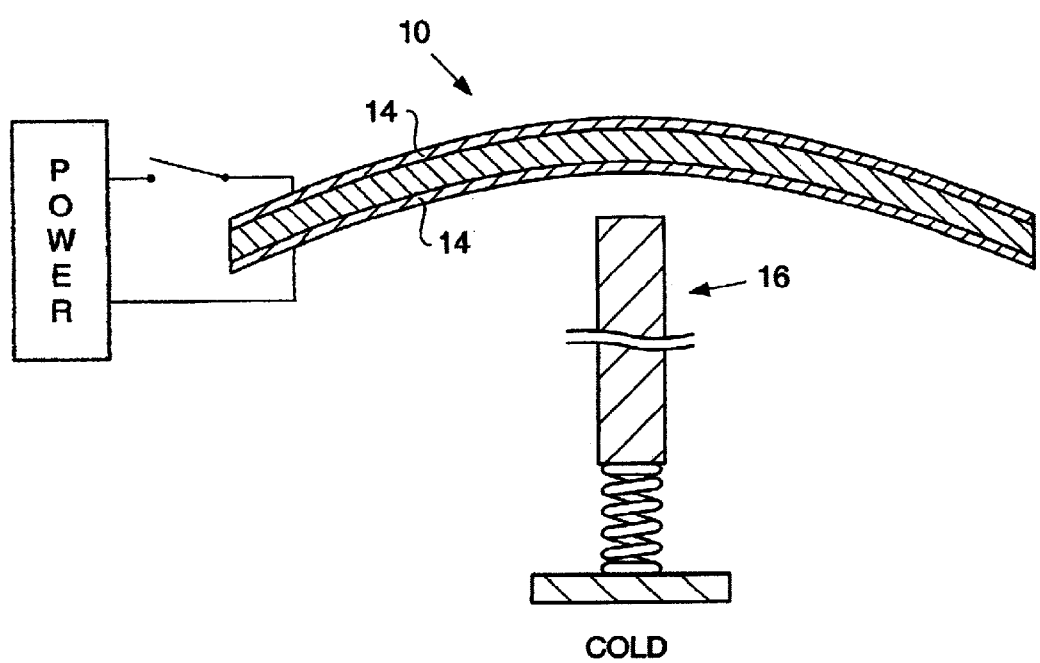
FIG. 3 shows one example of temperature deformation of a bender actuator.
Figure 4:
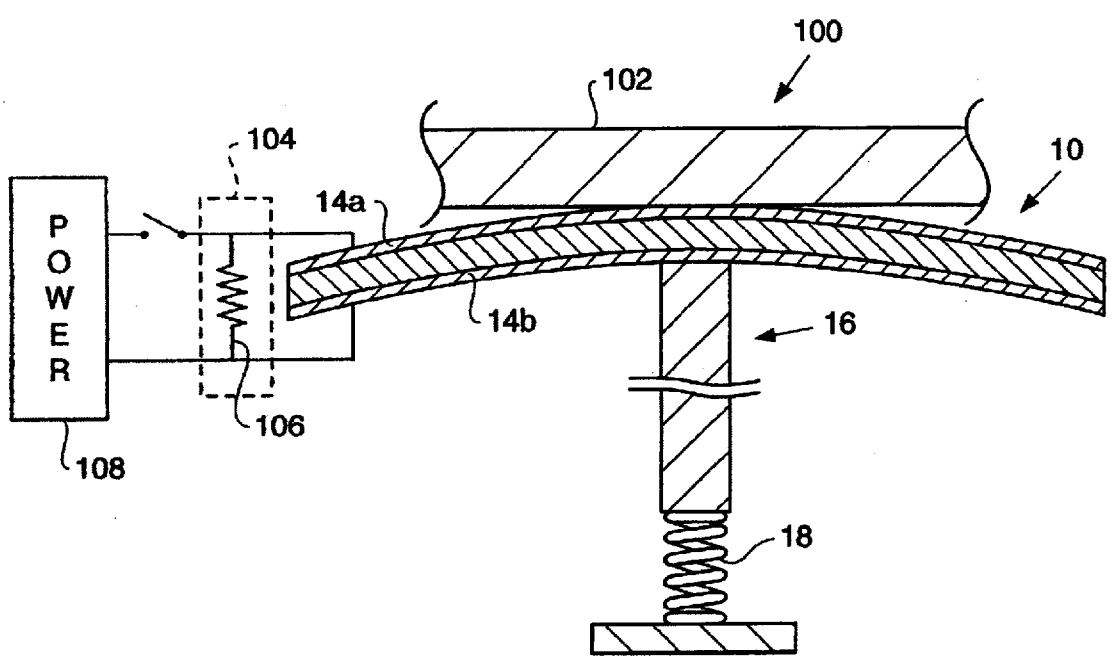
FIG. 4 shows an actuator device 100 according to one embodiment of the invention.

FIG. 4 shows an actuator device 100 according to one embodiment of the invention. The actuator device 10 typically includes the piezoelectric actuator, such as the piezoelectric bender 10 described above, although other types of bender actuators may also be used. The piezoelectric actuator 10 is shown in its un-actuated state (no power applied). A physical barrier, such as a stop 102, may be located a predetermined distance from the piezoelectric actuator 10 in a direction so as to prevent the displacement or doming of the bender actuator 10 beyond a predetermined point (e.g., the location of the stop). This is typically, although not always, on the convex side of the bender actuator 10. In FIG. 4, this predetermined distance is substantially zero, i.e., is substantially adjacent and/or in contact, or very close thereto, although other distances may be selected as desired.

The stop 102 is typically fixed in place by any of a variety of methods known to those skilled in the art, and is typically composed of a substantially rigid material, such as metal, plastic, ceramic, glass, wood, rock, etc.

A charge-redistributing device 104 may be coupled with the electrodes 14 of the piezoelectric actuator 10. The charge-distributing device 104 is typically capable of redistributing the charge, e.g., allowing current to flow, from one electrode 14a to the other electrode 14b, and may be any of a variety of devices known to those skilled in the art. The charge-redistributing device 104 may be capable of adding, subtracting, dissipating, reducing and/or equalizing the charge to/across the electrodes 14.

The charge redistribution on the electrodes 14 typically acts to reduce or substantially eliminate the electrical stresses placed on the bender actuator 10 by the temperature-induced deformation. Typically the energy that would otherwise cause the bender actuator 10 to deform with temperature is stored as an electrical field within the bender actuator, e.g., charge on the electrodes 14 because the deformation is substantially prevented by the stop 102.

Then, without a charge redistribution device 104, when an operating voltage is applied, energy must be expended to overcome the electrical field before movement of the bender actuator 10 will occur.

However, in embodiments of the invention, when an operating voltage is applied to the bender actuator 10, substantially all of the applied voltage goes to creating a desired electric field across the piezoelectric material 12 rather than to reducing the induced electrical field on the bender actuator 10 created by the temperature deformation. The electrical field built up in the bender actuator 10 are typically reduced or eliminated by the charge redistribution device 104. Thus, the energy introduced into the bender actuator 10 by the temperature induced deformation of the bender actuator 10 may be dissipated with little or no mechanical or electrical effect on the bender actuator 10.

Typical examples of the charge-redistributing device 104 include a resistor 106 or resistive circuit, an inductor, any of a variety of other components or circuits known to those skilled in the art that are capable of allowing charge to flow. The particular impedance values of the charge-redistributing device 104 may vary depending on the application that the bender actuator 10 is put to. For example, when using a resistor 106, generally a higher value resistor will have a lesser effect on the normal operation of the bender actuator 10 but a slower response time for redistributing the charge, while a lower value resistor will bleed more charge during normal operation but also redistribute the charge on the electrodes 14 more quickly for temperature compensation effects.

Alternately, in other embodiments, the charge-distributing device 104 could be switched in and out of the circuit used to power the bender actuator 10 as needed by ways known to those skilled in the art, e.g., a transistor or other type of electrical or mechanical switch. This would allow the charge-distributing device 104 to be absent, and therefore not drain any charge, for example, when the bender actuator 10 is to be actuated, but be present during other times to bleed or distribute charge from the electrodes 14.

Figure 5:
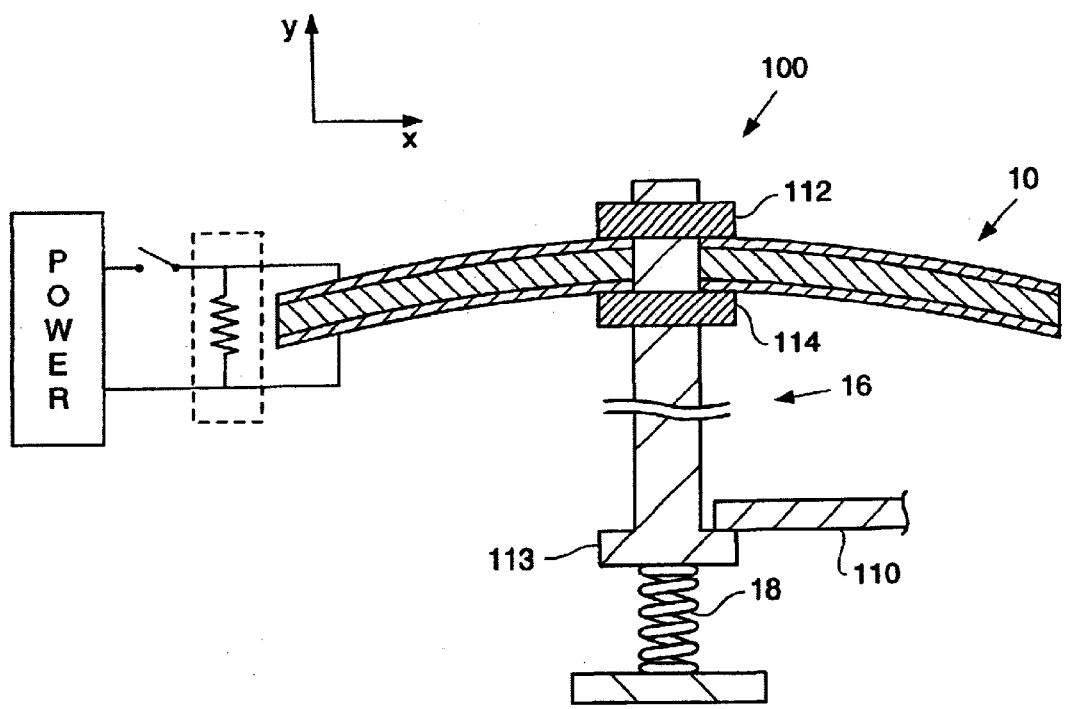
FIG. 5 shows an actuator device 100 according to another embodiment of the invention.

In another embodiment of the invention, shown in FIG. 5, the bender actuator 10 may be coupled with the rod 16 or other moveable object so that the displacement of the bender actuator 10 is limited by the rod 16, e.g., the freedom of movement by the rod 16. For example, the rod 16 may have a seat 110 that acts as the stop 102 and prevents the rod 16 from moving beyond a predetermined location in the positive y direction, for example (see axes on FIG. 5).

In one embodiment, the rod 16 may be fixedly and/or rigidly coupled with the bender actuator 10. The rod 16 may pass through a hole in the bender actuator 10 and mate with or otherwise be fixedly attached with a first collar 112. The rod 16 may be coupled with the bender actuator 10 by any of a variety of ways known to those skilled in the art, such as by gluing or using an adhesive, welding, soldering, riveting, clamping, screwing, bolting, etc. In other embodiments, the first collar 112 may be integrated into the rod 16 or the rod 16 may be shaped in such a way as to perform the same function without the need for the first collar 112.

This type of configuration thus prevents the bender actuator 10 from displacing in the positive y direction beyond the position of the first collar 112. The first collar 112 is in turn limited in its range of movement in the positive y direction by the rod 16, which is in turn limited in its movement by the seat 110.

In other embodiments, although described as a collar 112, the collar 112 may not completely surround the rod 16. Instead, the collar 112 may be a nub or bulge extending only a limited radial distance around the rod 16, e.g., 60 degrees.

In other embodiments the rod 16 need not be a rod. Instead, it may be any type of device configured to restrain or limit movement of the bender actuator 10. For example, a connecting device, such as a rod having a head end 113 opposite the bender actuator 10 could be used. The head end 114 may be used to engage the seat 110, and otherwise perform similarly to that which is described above.

In another embodiment a second collar 114 may be added. The second collar 114 to either prevent movement of the bender actuator 10 beyond a predetermined distance in the negative y direction, or to urge (with the aid of the spring 18) the bender actuator 10 in the positive y direction.

INDUSTRIAL APPLICABILITY

The actuator device 100 may be used to reduce the temperature induced deformation of piezoelectric devices, and to dissipate or reduce the stored energy built up by the bender actuator 10 because it cannot deform with temperature. This may lead to a more uniform response from the actuator device 100 over a range of temperatures.

What is claimed is:

1. A method for compensating for temperature induced deformation of a piezoelectric device that is operable to displace in a first direction as a function of a change in temperature, comprising:

preventing displacement of the piezoelectric device in the first direction beyond a first predetermined distance; and redistributing a charge on the piezoelectric device due to the temperature change to relieve internal stresses of the piezoelectric device due to temperature induced deformation.

2. The method of claim 1 wherein the piezoelectric device comprises a piezoelectric actuator.

3. The method of claim 1 wherein the first predetermined distance is substantially zero.

4. The method of claim 1 wherein preventing the displacement of the piezoelectric device comprises placing a physical barrier in a path of displacement of the piezoelectric device.

5. The method of claim 1 wherein preventing the displacement of the piezoelectric device comprises:

coupling a connecting device with the piezoelectric device, the connecting device operable to displace in a second direction as a function of displacement of the piezoelectric device; and limiting the movement of the connecting device in a second direction.

6. The method of claim 5 wherein the second direction comprises substantially the first direction.

7. The method of claim 1 wherein the piezoelectric device comprises a thermally pre-stressed bender actuator.

8. The method of claim 5 wherein the connecting device comprises a rod having a head end opposite the piezoelectric device and wherein placing a physical barrier in the path of displacement of the connecting device comprises placing a physical barrier in the path of the head end of the rod.

9. The method of claim 1 wherein the internal stresses of the piezoelectric device due to temperature induced deformation comprises an electric field created by the to temperature induced deformation.

* * * * *